United States Patent [19]

Shirai et al.

[11] Patent Number: 4,767,674
[45] Date of Patent: Aug. 30, 1988

[54] METAL CORED BOARD AND METHOD FOR MANUFACTURING SAME

[75] Inventors: Hideaki Shirai; Kimio Chiba; Koji Okawa; Hiroshi Ishibashi; Akihiro Ishii; Hirotaka Itoh; Hirokazu Kuzushita; Michihiko Yoshioka; Michio Hirose, all of Amagasaki, Japan

[73] Assignee: Dainichi-Nippon Cables, Ltd., Amagasaki, Japan

[21] Appl. No.: 759,209

[22] Filed: Jul. 26, 1985

[30] Foreign Application Priority Data

| Jan. 27, 1984 | [JP] | Japan | 59-14042 |
| Feb. 15, 1984 | [JP] | Japan | 59-21169 |
| Jul. 30, 1984 | [JP] | Japan | 59-118200 |
| Jul. 30, 1984 | [JP] | Japan | 59-118196 |
| Dec. 22, 1984 | [JP] | Japan | 59-271426 |
| Dec. 22, 1984 | [JP] | Japan | 59-271425 |

[51] Int. Cl.$^4$ .......................................... B32B 15/04
[52] U.S. Cl. ................................ 428/461; 428/463; 428/469; 428/671; 428/626; 428/627; 361/411; 439/85
[58] Field of Search ............... 428/458, 461, 463, 469, 428/472, 636, 637–640, 626, 627, 671, 68.5; 361/411; 339/17 T, 17 A

[56] References Cited

U.S. PATENT DOCUMENTS

| 2,787,561 | 4/1957 | Sanders | 428/379 |
| 3,984,907 | 10/1976 | Vossen et al. | 428/626 |
| 4,311,768 | 1/1982 | Berdan et al. | 428/626 |
| 4,503,112 | 3/1985 | Konicek et al. | 428/626 |

FOREIGN PATENT DOCUMENTS

| 51-6143 | 1/1976 | Japan . |
| 51-12673 | 1/1976 | Japan . |
| 51-49468 | 4/1976 | Japan . |
| 35374 | 8/1983 | Japan | 428/469 |
| 951266 | 3/1964 | United Kingdom | 428/461 |
| 2060435 | 5/1981 | United Kingdom | 428/469 |
| 2140460 | 11/1984 | United Kingdom | 428/469 |

OTHER PUBLICATIONS

Technical Notes, RCA, "Relatively Low Loss, Matching Dielectric Constant Bonding of Cu Sheets to Alumina and Other Substrates", pp. 1-2, #856, 1970.

*Primary Examiner*—Edith Buffalow
*Attorney, Agent, or Firm*—Armstrong, Nikaido, Marmelstein & Kubovcik

[57] ABSTRACT

It is disclosed that a metal cored board which comprises an electrically conductive layer whose one surface at least composed of a hardly oxidizable metal, an insulating organic polymer layer baked on the surface of the hardly oxidizable metal, and a metal core adhered on the insulating organic polymer layer, and a method for manufacturing a metal cored board, which comprises a step to coat the surface of a hardly oxidizable metal layer of an electrically conductive metal foil with an insulating varnish, a step to bake a layer of the varnish, and a step to adhere a metal core on the baked varnish layer.

7 Claims, 3 Drawing Sheets

METAL CORED BOARD AND METHOD FOR MANUFACTURING SAME

BACKGROUND OF THE INVENTION

The present invention relates to a metal cored board and a method for manufacturing the same, which is used suitably for preparing a hybrid integrated circuit.

Up to this day, it has been proposed a method for preparing a plate board of hybrid integrated circuit having such a construction that an organic polymer film is adhered on its one surface with a foil of an electrically conductive metal for forming electric circits and also adhered on its another surface with an aluminium heat sink. The plate board, however, is poor in electrical breakdown strength, because most of the organic polymer films made by extrusion or casting have pinhols.

According to the studies of the present inventors, a plate board of hybrid integrated circuit having an excellent dielectric breakdown strength can be obtained by an insulating layer composed of a baked organic polymer instead of the above organic polymer film. The plate board is prepared by coating an electrically insulating varnish on the surface of an aluminium heat sink, baking the coated layer to form an electrical insulating layer, and then by adhering thereon a foil of an electrical conductive metal. The varnish can be applied, for example, by electrophoretical coating.

It is, however, difficult to form a baked layer tightly bonded on the surface of aluminium. On the other hand, it has been well-known in the technical field of electrophoretical coating of aluminium that the surface of the aluminium is treated with a zincate in advance of coating, in order to improve the bonding strength of the baked layer.

The present inventors found furthermore the fact that, though the bonding strength of a baked organic polymer layer on the surface of aluminium is improved by zincate treatment, it is not yet sufficient in the standpoint of being used in a plate board of hybrid integrated circuit. Namely, when such a plate board is heated locally in order to solder the aluminium heat sink or the electrically conductive metal layer to another electrical part, the baked organic polymer layer is peeled off from the aluminium heat sink.

SUMMARY OF THE INVENTION

An object of the present invention is to provide a metal cored board having excellent dielectric breakdown strength.

Another object of the present invention is to provide a metal cored board having an electrical insulating layer which is durable against peeling not only at room temperature but also at a high temperature.

Still another object of the present invention is to provide a metal cored board having an electrical insulating layer which is improved in thermal conductivity.

Still another object of the present invention is to provide a method for manufacturing a metal cored board.

More specifically, the present invention provides a metal cored board, which comprises an electrically conductive layer whose one surface at least composed of a hardly oxidizable metal, an insulating organic polymer layer baked on the surface of the hardly oxidizable metal, and a metal core adhered on the insulating organic polymer layer.

Furthermore, the present invention provides a method for manufacturing a metal cored board, which comprises a step to coat the surface of a hardly oxidizable metal layer of an electrically conductive metal foil with an insulating varnish, a step to bake a layer of the varnish, and a step to adhere a metal core on the baked varnish layer.

BRIEF DESCRIPTION OF THE DRAWINGS

Each of FIGS. 1 to 5 is the sectional view of an embodiment of the present invention.

DETAILED DESCRIPTION OF THE INVENTION

Figure 1:
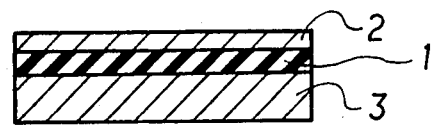
Figure 5:
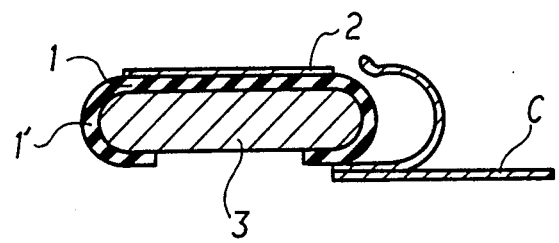

Referring now to FIGS. 1 and 5, an electrically insulating layer 1 is formed with a varnish by coating and baking on an electrically conductive layer 2, and a metal core 3 is adhered on the insulating layer 1 with or without an adhesive layer 4. The electrically conductive layer 2 is composed all or mostly of an electrically conductive metal having a volume resistivity at 25° C. of lower than $10 \times 10^{-6}$ ohm. cm., preferably lower than $5 \times 10^{-6}$ ohm. cm., such as copper, nickel, aluminium, silver, gold, and the like. In the present invention the surface of the electrically conductive metal layer 2 should be composed of a hardly oxidizable metal, such as copper, nickel, silver, gold, tin, etc., because the baked insulating organic polymer layer 1 formed on the layer of such a hardly oxidizable metal has excellent resistance against peeling. When the layer 2 is made of a hardly oxidizable metal, for example, copper, it is unnecessary to form another hardly oxidizable metal layer on the copper.

Figure 2:
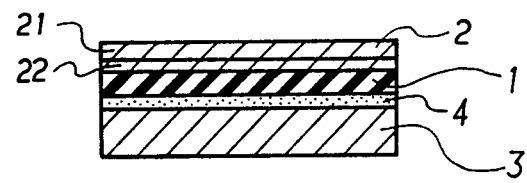
Figure 3:
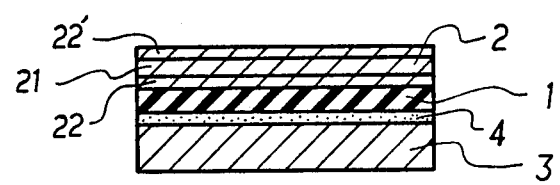

In FIGS. 2 and 3 the layer 2 consists of a layer 21 of an oxidizable and electrically conductive metal, such as aluminium, and hardly oxidizable metal layer 22 provided on the layer 21, and the embodiment of FIG. 3 has another hardly oxidizable metal layer 22'.

Coating of the insulating varnish can be conducted by various ways, preferably by electrophoretical deposition.

In the case where aluminium (or like oxidizable metal) is coated by electrophoretical deposition, voltage is applied between an aluminium to be coated and an opposite pole, both of which are immersed in an electrodeposition bath. Because always there is a layer of aluminium oxide on the surface of aluminium, the aluminium oxide layer will prevent the aluminium from dissolving so as to accelerate the electrolysis of water in the electrodeposition bath. As a result, in the electrophoretical coating of aluminium there occurs electrodeposition of organic polymer and the electrolysis of water simultaneously to form an organic polymer layer which includes a remarkable amount of gas. The gas lowers the electric breakdown strength and the resistance against peeling of the organic polymer layer on the aluminium. On the contrary, a layer of a hardly oxidizable metal can be coated by electrophoresis evenly and without electrolysis of water.

The electrical insulating layer 1 formed electrophoretically on the layer 2 is excellent in dielectric breakdown strength and resistance against peeling, because the layer 1 is even, and free from gas for the reason above mentioned.

The electrical insulating layer 1 may also be formed by conventional mechanical coating followed by baking. In this conventional way the coating and baking are repeated generally at least 2 times, preferably 3 to 10 times to accumulate layers to a desired thickness. This repeated coating and baking are effectively decrease pinholes in the accumulated layer thus to form an insulating layer having higher dielectric breakdown strength than that of an organic polymer film prepared by extrusion or castng.

The surface, to be covered with the insulating layer 1, of the electrically conductive layer 2 is preferably rough, for example having a roughness $R_{max.}$ as defined in JIS B 0601 of from about 0.1 to 10 μm, in order to obtain further improved resistance aginst peeling of the insulating layer 1. Such a rough surface can be obtained by grinding the surface of the layer 2 with sand paper, sand blast, a grinding roll, and like grinding or polishing means. From the above viewpoint, a conductive metal foil produced by electro-plating such as electro-plated copper foil is preferable as a material of the layer 2, because the foil has a favorable rough surface.

The insulating layer can be formed by using a variety of insulating varnishes. As the varnishes, those which are used in the manufacturing magnet wires, for example, polyvinylformal, polyamide, polyurethane, polyester, polyimide, polyamideimide, and varnishes for electrodeposition coating are exemplified.

Anionic varnishes and cathionic varnishes of dispersion type or solution type using water or a mixture of water and an organic solvent as a dispersant or solvent may be used as an electrodeposition coating varnish in the present invention.

Examples of the electrodeposition varnish are those composed of a material which can be obtained by reacting at least one member selected from the group consisting of acrylonitrile, methacrylonitrile, an ester of acrylic acid, etc., at least one member selected from the group consisting of glycidylacrylate, dlycidylmethacrylate, allylglycidylether, acrylamide, methylolacrylamide, ethylolacrylamide, etc., and at least one member selected from the group consisting of acrylic acid, methacrylic acid, ethylacrylic acid, crotonic acid, vinylacetic acid, tiglic acid, 2-pentenoic acid, 2-hexenoic acid, cinnamic acid, maleic acid, fumaric acid, itaconic acid, etc., and the material has preferably a degree of polymerization of about 100,000 to 1,000,000.

Preferable examples of the electrodeposition coating varnish are a copolymer of (a) at least one compound (hereinafter, designated the a-component for brevity) represented by the formula (I):

and (b) at least one compound (hereinafter, the b-component) of the formula (II):

and (c) an unsaturated organic acid (hereinafter, the c-component) having 3 to about 30 carbon atoms and at least one double bond which is reactable with the double bond of the a-component or b-component.

In the formula (I) or (II), $R_1$ represents hydrogen atom and an alkyl group having 1 to 30 carbon atoms, such as methyl, ethyl, propyl and the like, $R_2$ represents a cyano group, an aldehyde group and a carboxyalkyl ester group having 2 to about 30 carbon atoms, such as carboxymethyl ester, carboxyethyl ester, carboxypropyl ester, carboxybrtyl ester and the like, $R_3$ and $R_4$ each represents a hydrogen atom, an amide group, a glycidyl ester group, glycidyl ether group and an organic group having 1 to about 30 carbon atoms selected from the group consisting of an alkyl group, such as methyl, ethyl, propyl, butyl and the like, an N-alkylamide group, such as N-methylamide, N-ethylamide, N-propylamide and the like, and an alkylol group, such as methylol, ethylol, propylol and the like, except that both $R_3$ and $R_4$ are not simultaneously a hydrogen atom or an alkyl group. When the number of carbon atoms of the above c-component and the $R_1$, $R_2$, $R_3$, or $R_4$ organic groups exceed about 30, the heat resistance of the resulting polyacryl resin tends to decrease and, therefore, the maximum number of carbon atoms of the c-component and the above $R_1$, $R_2$, $R_3$, or $R_4$ organic groups preferably does not exceed about 20.

Examples of the c-component are monobasic unsaturated acids, such as acrylic, crotonic, vinylacetic acid, methacrylic, tiglic, α-ethylacrylic, β-methylcrotonic, 2-pentenoic, 2-hexenoic, 2-heptenoic, 2-octenoic, 10-undecenoic, 9-octadecenoic, cinnamic, atropic, α-benzylacrylic, methyl atropic, 2,4-pentadienoic, 2,4-hexadienoic, 2,4-dodecadienoic acid, 9,12-octadecadienoic acid, dibasic unsaturated acids, such as maleic, fumaric, itaconic, citraconic, mesaconic, glutaconic, dihydromuconic, muconic, and tribasic unsaturated acids, such as 1,2,4-tricarboxylic butene and the like.

The polyacryl resin used in the present invention can be prepared by the well-known polymerization procedures such as an emulsion polymerization, a solution polymerization, a suspension polymerization and the like as described, for example, in U.S. Pat. Nos. 2,787,561 and 3,509,033, and in "Acryl Resin" by Kou Asami, published by Nikkan Kogyo shinbun, Tokyo, 1970, p. 25 to p. 27, using about 1 to 20 moles, preferably about 2 to 10 moles, or most preferably about 4 to 6 moles, of the a-component per one mole of the b-component and about 0.01 to 0.2 mole, preferably about 0.03 to 0.1 mole of the c-component per one mole of the a-and b-components, i.e., per mole of the sum of the moles of the a-component and the b-component.

Among the above described a-, b-, and c-components, more preferred examples are those components in which the total number of carbon atoms is less than 15 from the standpoint of the heat resistance of the polyacryl resin obtained. More preferred examples of the a-component are acrylonitrile, metharylonitrile, methylacrylate, ethylacrylate, propylacrylate, butylacrylate, methylmethacrylate, ethylmethacrylate, proptlmethacrylate, and acrolen. More preferred examples of the b-component are glycidylacrylate, glycidylmethacrylate, allylglycidylether, acrylamide, methylolacrylamide, and ethylolacrylamide. More preferred examples of the c-component are acrylic acid, methacrylic acid, α-ethylacrylic acid, crotonic acid, maleic acid, and fumaric acid.

The polyacryl resin employed in the present invention may also be those modified with one or more of styrene and its derivatives or diolefins. As the derivatives of styrene, there are employed those compounds in which the phenyl group of styrene is substituted with at least one group selected from the group consisting of a cyano group, a nitro group, a hydroxy group, an amine group, a vinyl group, a phenyl group, a halogen atom such as chlorine, bromine, etc., an organic group having 1 to 20 carbon atoms, such as an alkyl group, an aralkyl group, an N-alkylamine group. Examples of the above alkyl group are methyl, ethyl, propyl, butyl, etc., and examples of the above aralkyl groups are benzyl, $\alpha$- or $\beta$-phenylethyl, etc., and examples of the above N-alkylamine groups are N-methylamine, N-ethylamine, N-propylamine, etc. Among the styrene derivatives, those which have 1 to 3 substituent groups are preferable because of their ready reactivity with the a- to c-components. Preferable examples are methyl styrenes, ethyl styrenes, divinyl benzenes, chlorostyrenes. As the diolefins as a modifying agent, those compounds are used whose total number of carbon atoms is 3 to about 20, preferably 4 to about 10. Examples of the above diolefins are the butadienes, pentadienes, methyl-butadienes and the like.

Polyacryl resins modified with those modifying agents can be prepared using well-known polymerization methods previously described using starting material mixture containing one or more of the above modifying materials in addition to a-, b-, and c-components. However, the amount of styrene and its derivatives or diolefins restricted preferably to about 2 moles or one mole or less, respectively, per one mole of the a-component.

In the present invention, a polyacryl resin (including the modified resin) having preferably a degree of polymerization of approximately about 10,000 to about 1,000,000 is used, since a polyacryl resin having too low a degree of polymerization is lacking in toughness, and in turn a polyacryl resin having too high a degree of polymerization tends to result in a somewhat uneven coating surface due to a poor fluidity of the resin in the uncured state. Therefore, more preferably polyacryl resins are those having a degree of polymerization of about 100,000 to about 500,000.

The polyacryl resin employable in this invention prepared by any one of the prior art processes can be coated in the form of a dispersion or a solution in water or in an appropriate organic solvent such as N-methyl-2-pyrrolidone, N,N-dimethylformamide, N,N-dimethylacetamide, dimethylsulfoxide and the like using a polymer concentration of about 5 to about 50, preferably about 10 to about 30% by weight and subsequently the coating can be baked at a temperature ranging from about 100° C. to about 600° C., preferably about 200° C. to 500° C., whereby a tough insulating layer can be formed on the copper plating layer by baking.

The metal core 3 may be adhered to the baked insulating layer 1 with a commercially available adhesive. Though various chemical kinds of adhesives may be used, preferable are those which are heat-resistant. Examples of such heat-resistant adhesives are epoxy-types such as EPOX-AH-331, EPOX-AH-332, EPOX-AH-333 from Mitsui petrochemical Co. Ltd, Silicon types such as YR-3286 from Tochiba Silicon Co. Ltd, epoxy-nylon types such as AF-42 from Minesota Mining and Manufacturing Co. Ltd, imide types such as BT resin base adhesive from Mitsubishi Gas Chemical Co. Ltd, RAMDITE from Denki chemical Co. Ltd., etc.

The metal core 3 may also be adhered without adhesive layer 4 in such a manner that a varnish layer coated on the conductive metal layer 2 is semicured to become B stage, and then superimposed on a metal core 3, and finally heat-pressed to be baked completely, while the two layers 1 and 3 are adhered tightly. The metal core 3 is composed with various kinds of metals such as aluminium, copper, and like thermal conductive metals, iron, steels such as silicon steel, stainless steel, and like metals having good magnetic permeability.

When the metal cored board of the present invention is used as a plate board of hybrid integrated circut, the electrical insulating layer 1 is required to have good thermal conductivity. This requirment is attributed to the necessity of releasing effectively the Joule's heat generated from an electric circuit which is formed in the metallic layer 2 An electrical insulating layer in the hybrid integrated circuit hereto used is in general thick due to its low dielectric breakdown strength, and therefore is poor in heat releasing owing to low thermal coductivity of organic polymer. On the contrary, in the present invention adoption of thinner electrical insulating layer, which is advantageous for heat releasing, is possible, because of high dielectric breakdown strength of the baked insulating layer 1. The thickness of the insulating layer 1 is in general from 20 to 80 $\mu$m, preferably from 30 to 50 $\mu$m.

In the present invention the electrical insulating layer 1 may include a thermally conductive filler in order to improve its thermal conductivity. Such an electrical insulating layer 1 can be formed by using a varnish including a thermally conductive filler, such as alumina, boron nitride, silicon nitride, aluminium nitride, magnesia, beryllia, fluorite, and the like. The thermally conductive filler is in particle size, for example, from 0.1 to 20 $\mu$m, preferably from 0.5 to 5 $\mu$m from the standpoint of obtaining even dispersion thereof in the varnish. The amount of the filler in the varnish is, for example, from 0.5 to 30 parts by weight, preferably from 1 to 10 parts by weight per 100 parts by weight of the resin included in the varnish from the standpoint of compatibility in thermal conductivity and electrical insulating property of the insulating layer 1.

Figure 4:
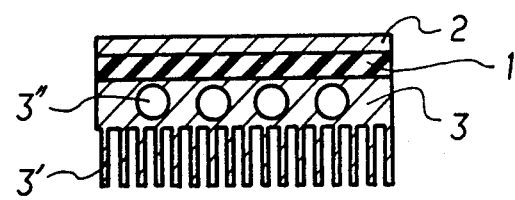

Another embodiment of the invention shown in FIG. 4 has the metal core 3 provided with a plurality of fins 3' and through bores 3''. The fins and through bores improve heat releasing of the metal 1. A embodiment having either fins or through bores also exhibits good heat releasing.

Still another embodiment of the present invention shown in FIG. 5 has the metal core 3 whose edges are scraped and side walls covered with an electrical insulating layer 1'. Owing to the structure, the metal layer 2 of the embodiment can be connected electrically to another electrical part by simple insert of a clip C as shown in FIG. 3.

Figure 6:
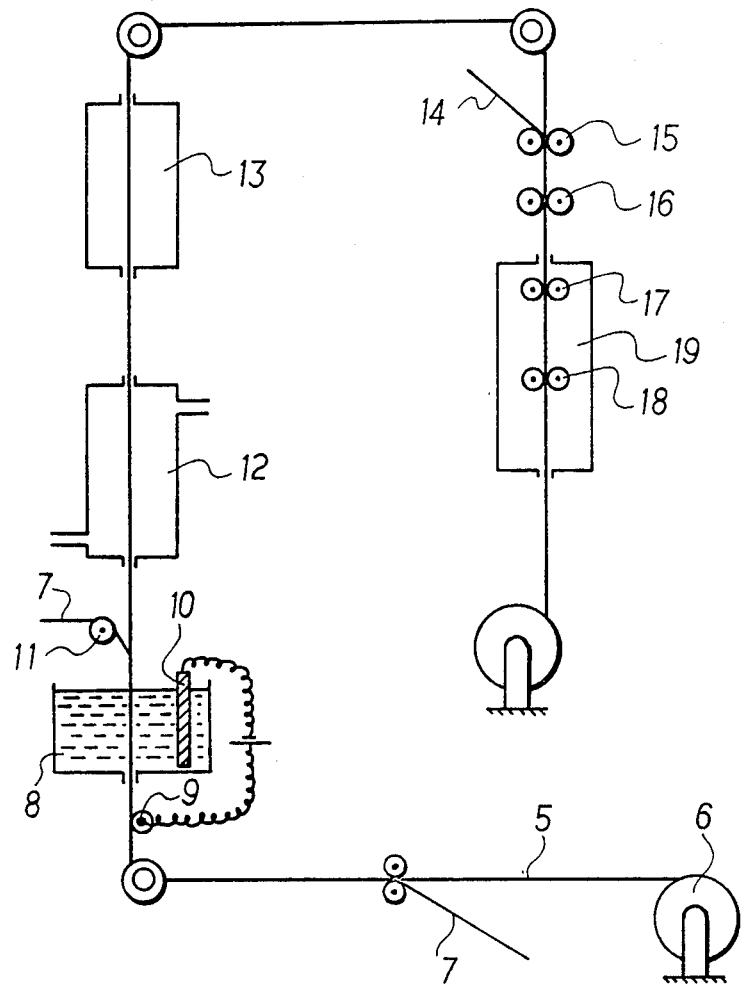
FIG. 6 is an explanatory figure for explaining an embodiment to manufacturing continuously a metal cored board of the present invention.

Refering now in FIG. 6, an embodiment of the method for manufacturing the metal cored board of the present invention is explained.

An electrically conductive metal foil 5, such as copper foil, is taken off cotinuously from a drum 6, and is masked for one surface thereof with a masking tape 7, such as polyvinylchloride visco-adhesive tape. The non-masked surface of the metal foil is coated electrophoretically with an electrodeposition varnish at a bath 8. The electrodeposition is carried out by applying voltage between a rolling pole 9 which is brought into contact with the metal foil 5 and an opposite pole 10 which is located in the bath 8. The general conditions in the electrodeposition are from 1 to 60 V in voltage to be applied, from 0.5 to 10 mA/cm$^2$ in current density, from 1 to 60 seconds in retention time in the bath, and from 10 to 25% by weight in concentration of resin in the electrodeposition varnish.

The surface of the metal foil to be coated, if not rough, is roughened preferably in advance of electrodeposition with aid of a suitable grinding means, such as a grinding roll, in order to improve the peeling strength of the electrodeposition layer.

In the present invention a variety of electrodeposition varnishes may be used as mentioned already. Among them, anionic varnishes are preferable from the view point of realizing an electrical insulating layer which is excellent in thermal conductivtity from the following reason. Namely, in the case where an anionic varnish is used, the metal foil 5 to be coated is made the anode. As a result, a part of metal in the metal foil 5 dissolves in the varnish in the course of the electrodeposition to form an organic polymer layer containing metal. The metal improves the thermal conductivity of the layer. A care must be taken, however, about the fact that too much amount of the metal lowers the dielectric breakdown strength of the layer, and therefore it is necessary to control the amount. Preferable amount thereof is from 0.1 to 1% by weight. From the above viewpoint, preferable conditions of electrophoretical deposition are from 15 to 25 V in voltage and from 0.9 to 5 mA/cm$^2$ in ourrent density.

After the deposition, the masking tape 7 is removed through a roll 11 and the electrodeposition layer is subjected to a treatment at a chamber 12. Though this treatment doed not need necessarily in the present invention, it is recommendable from the reason that the treatment accelerates coagulation of resin particles in the electrodeposition layer to improve its dielectric breakdown strength. In this treatment the layer is brought into contact with an organic solvent or a high temperature steam of about from 300° to 600° C. for from about 1 to 60 seconds, preferably about 3 to 30 seconds.

Organic solvents which are capable of at least swelling the electrodeposition layer and dissolving water are preferable. Examples of such organic solvent are monohydric or polyhydric alcohols such as methanol, ethanol, propanol, ethylene glycol, glycerine and the like, cellosolves such as ethylene glycol monomethyl ether, ethylene glycol monoethyl ether, ethylene glycol isopropyl ether, ethylene glycol monobutyl ether, ethylene glycol diethyl ether, ehtylene glycol dibutyl ether, ethylene glycol monophenyl ether and the like, nitrogencontaining organic solvents such as N,N-dimethyformamide, N,N-dimethylacetamide, N-2-methylpyrrolidone and the like, sulfur-containing organic solvents such as dimethylsulfoxide, etc. In particular, N,N-dimethylformamide, N,N-dimethylacetamide, N-2-methylpyrrolidone and dimethylsulfoxide are prefarred.

When an organic solvent is used, the layer is treated with the solvent of room temperature or a high temperature above its boiling in the state of vapor, liquid, or mist, preferably with the solvent in the state of mist at a temperature of from room temperature to 100° C.

The electrodeposition layer thus treated is then heated at a preheating furnace 13 to be made semicured state (B stage). Such a semicure is achieved, for example, by heating at a temperature of from ⅓ to 3/5 of the temperature for final curing or baking for from about 5 to 120 seconds.

A strip 14 of a metal core 3, such as aluminium, having an adhesive layer in its one surface is applied on the semicured electrodeposition layer in the condition that the adhesive layer is faced to the semicued layer. While the foil 5 with the strip 14 applied thereon passes through a main heating furnace 19 having compression rolls 17 18 . . . therein via compression rolls 15 and 16, the electrodeposition layer and adhesive layer are heated to a temperature of, for example, 150° to 300° C., for 20 to 40 minutes. By this heating final baking and adhesion are achieved simultaneously.

Oxidation of the foil and deterioration of the organic layers, if any, can be solved by filling the furnaces 13 and 19 with an inert gas such as nitrogen, argon and the like.

In the modified example of the embodiment shown in FIG. 6 the electrodeposition layer is baked completely at the preheating furnace 13, and only a heating necessary for adhesion is applied at the furnace 19.

A metal foil (or strip) consisting of an aluminium layer having on one surface or on both surfaces thereof a copper plating layer or layers is preferable as the electrically conductive metal foil 5 in the present invention. Such a foil can be produced, for example, by zinc plating the surface(s) of an aluminium foil with a zincate and then by plating copper. Zinc plating can be carried out by well-known zincate treatment with an aqueous solution which can form a zinc layer on the surface of the aluminium strip. Examples of the aqueous solution are a solution of a chmical compound of zinc such as zinc oxide, and a caustic alkali such as caustic soda, especially an aqueous solution comprising 200–600 g/l of caustic soda, 20–200 g/l of zinc oxide, 0.5–20 g/l of ferric chloride, 1–100 g/l of potassium tartrate, and 0.5–20 g/l of sodium nitrate. Bondal solution and like commertialy available zincate solutions may also be used preferably.

The zincate treatment may be conducted at an arbitrary temperature. However, treatment at too low temperature requires long times for the formation of zinc layer, on the other hand, treatment at too high temperature tends to fail in formation of zinc layer which bonds tightly on the surface of the aluminium strip, and therefore the treatment is conducted preferably at a temperature of from 20° to 65° C., more preferably, from 25° to 55° C., and a treatment time of from 1 to 60 seconds, more preferably, from 3 to 30 seconds.

The following examples illustrates in greater detail the aluminium cored board of the present invention and the method for manufacturing the aluminium cored board, but they are not to be costrued as limiting the scope of the present invention. In the following examples part and % all means as part by weight and % weight, respectively.

EXAMPLE 1

A copper foil produced by electro-plating procedure, having a thickness of 35 μm is masked with a polyvinylchloride visco-adhesive tape for one surface thereof, and is coated electrophoretically with a water dispersion varnish of epoxy-acryl (V-551-20 from Ryoden Kasei Co., Ltd, concentration of rein: 20%) to form an electrodeposition layer thereon under the conditions of 30° C. in the varnish temperature, 1.8 mA/cm$^2$ in current density, 45 seconds in retention time, 100 mm in distance between two poles, and the copper plating layer being the anode.

The electrodeposition layer 40 μm in thickness is treated with N,N-dimethylformamide at a temperature of 30° C. for 10 seconds and, after removing the masking tape, the layer is subjected to primary cure by heating at a temperature of 150° C. for 30 minutes. The primary cured (B stage) electrodeposition layer is then adhered to an aluminium strip of 1 mm thick with an adhesive film (Pyralux LF-0100, 25 μm in thickness, from Du Pont Co., Ltd) by heat-pressing at 200° C., for 40 minutes and under a pressure of 20 kg/cm². Thus, an aluminium cored board is prepared, which is about 1.1 in thickness.

COMPARATIVE EXAMPLE 1

An aluminium cored board having a thickness of 1.10 mm was produced in the same manner as in Example 1, except that an aluminium foil having a thickness of 35 μm is used instead of the copper foil.

COMPARATIVE EXAMPLE 2

An aluminium cored board having a thickness of 1.10 mm was produced in the same manner as Comparative in Example 1, except that the aluminium foil is treated with Bodal zincate solution at 25° C.

EXAMPLE 2

Making of an aluminium cored board 1.15 mm in thickness including 40 μm thick insulating layer is duplicated in the same manner as in Example 1 with the exception that instead of the copper foil an aluminium-copper complex foil 90 μm in thickness is used. The complex foil is produced by the following manner that an aluminium foil 50 μm thick is treated with an aqueous solution of caustic soda to remove aluminium oxide layer on the both surfaces thereof, treated with an aqueous zincate aolution consisting of 400 g/l of caustic soda, 100 g/l of zinc oxide, 1 g/l ferric chloride, 5 g/l of potassium tartrate, and 5 g/l of sodium nitrate at a temperature of 30° C. for 30 seconds to form zinc plating, and washed. Copper plating layer 10 μm in thickness is then formed on the zinc plating by electrodeposition, washed and dried. Thus, an aluminium plate having layers of zinc and copper.

The copper plating layer is roughened by sand paper of No. 200 in advance of the electrodeposition coating.

EXAMPLES 3 to 7

An aluminium cored board was produced in the same manner as in Example 1, except that instead of the varnish used in Example 1, a varnish described below was used in each Example, respectively, that is, varnish-A in Example 3, varnish-B in Example 4, varnish-C in Example 5, varnish-D in Example 6, and varnish-E in Example 7.

Varnish-A;

A monomer mixture consisting of 5 moles of acrylonitrile, 1 mole of acrylic acid, 0.3 mole of glycidylmethacrylate, 760 g of deionized water, 7.5 g of sodium lauryl sulfate, and 0.13 g of sodium persulfate were charged into a flask, and stirred under a nitrogen stream at room temperature for 15 to 30 minutes. Thereafter the mixture was reacted at a temperature of 50° to 60° C. for a period of 4 hours to obtain an acryl varnish as an aqueous desperaion.

Varnish-B;

The acryl varnish was prepared in the same manner as described in the preparation of Varnish-A but using a monomer mixture consisting of 5 moles of acrolein, 1 mole of methacrylic acid and 0.3 mole of acrylic amide in place of the monomer mixture of Varnish-A.

Varnish-C;

The acryl varnish was prepared in the same manner as deacribed in the preparation of Varnish-A but using a monomer mixture consisting of 5 moles of ethylacrylate, 1 mole of acrylic acid, 0.3 mole of methylol acrylamide, 1200 g of deionized water, 12 g of sodium lauryl sulfate and 0.2 of sodium persulfate.

Varnish-D;

The acryl varnish was prepared in the same manner as described in the preparation of Varnish-A but using 5 moles of acrylinitrile, 1 mole of maleic acid, 0.3 mole of glycidyl methyacrylate, 840 g of deionized water, 8 g of sodium lauryl sulfate and 0.15 g of sodium persulfate.

Varnish-E;

The acryl varnish was prepared in the same manner as described in the preparation of Varnish-A but using 5 moles of acrylonitrile, 1 mole of acrylic acid, 0.3 mole of glycidyl methacrylate, 2 moles of atyrene, 1200 g of deionized water, 12 g of sodium lauryl sulfate and 0.2 g of sodium persulfate.

The peeling strength between the conductive metal foil and the baked organic polymer layer was measured by 90 degree peeling at room temperature about 10 specimens taken from each of Examples and Comparative Exaples. Two series of measurments were conduted, that is, 5 specimens were measured without heating (initial value), and other 5 specimens were measured after heating at 200° C. for 60 minutes. The results were shown below with the average value of the 5 data.

Comparative Example 1 (initial: 0.4 kg/cm, after heating: 0.1 kg/cm), Comparative Example 2 (initial: 0.5 kg/cm, after heating: 0.2 kg/cm), Example 1 (initial: 2.0 kg/cm, after heating: 1.9 kg/cm), Example 2 (initial: 2.0 kg/cm, after heating: 1.9 kg/cm), Example 3 (initial: 1.9 kg/cm, after heating: 1.7 kg/cm), Example 4 (initial: 2.1 kg/cm, after heating: 1.8 kg/cm), Example 5 (initial: 2.0 kg/cm, after heating: 1.7 kg/cm), Example 6 (initial: 1.9 kg/cm, after heating: 1.7 kg/cm), Example 7 (initial: 1.8 kg/cm, after heating: 1.8 kg/cm).

COMPARATIVE EXAMPLE 3

A glass cloth 90 μm in thickness is impregnated with an epoxy resin consisting of 10 parts of EPYCOTE 828 ®, 20 parts of diamino diphenyl methane, and 1 part of BF-400 ®, and the epoxy resin is cured to B stage. The glass cloth is sandwiched between an aluminium plate 1.0 mm in thickness and a copper foil 35 μm in thickness. The assembly is then heat-pressed to obtain an aluminium cored board having glass-epoxy insulating layer 100 μm in thickness.

COMPARATIVE EXAMPLE 4

An aluminium cored board having an polyimide insulating layer 60 μm in thickness is produced in the same manner as in Comparative Example 4, except that a polyimide film 50 μm in thickness having a layer of adhesive (EPOX AH-333 ® from Mitsui Petrochemical Co., Ltd) on both surfaces is used instead of the glass-epoxy rein.

EXAMPLE 8

An aluminium cored board having an insulating layer 40 μm in thickness is produced in the same manner as in Example 1, except that it is used a varnish consisting of 100 parts of the varnish used in Example 1 and 20 parts of aluminium powder about 1 μm in particle size.

The test specimens taken from Examples 1, 7, 8, and Comparative Examples 3, and 4 are subjected to the following two measurmens. Dielectric breakdown voltage (abbreviated to DBV): according to JIS C 2110, and Heat resistance (abbreviated to HR): the transitional heat resistance is measured by means of a power transistor TO-220 soldered on the reverse surface of the aluminium core. The results were shown below. The values shown are average of 5 data.

Example 1 (DBV: 9.5 kV, HR: 2.2 °C./W), Example 7 (DBV: 8.9 kV, HR: 2.3 °C./W), Example 8 (DEV: 8.0 kV, HR: 1.2 °C./W), Comparative Example 3 (DBV: 5.2 kV, HR: 4.8 °C./W), and Comparative Example 4 (DBV: 10.0 kv, HR: 3.7 °C./W).

What is claimed is:

1. A metal cored board which comprises an electrically conductive layer at least one surface of which is composed of a hardly oxidizable metal, an insulating organic polymer layer baked on the surface of the hardly oxidizable metal, and a metal core adhered on the insulating organic polymer layer.

2. A metal cored board of claim 1, wherein the electrically conductive layer is composed of an electrically conductive metal having a volume resistivity at 25° C. of lower than $5 \times 10^{-6}$ ohm. cm.

3. A metal cored board of claim 1, wherein the hardly oxidizable metal is a member selected from the group consisting of copper, nickel, silver, gold, and tin.

4. A metal cored board of claim 2, wherein the electrically conductive layer is composed of an oxidizable metal layer having on at least one surface thereof a hardly oxidizable metal layer.

5. A metal cored board of claims 1 to 4, wherein the insulating organic polymer layer is a polyacryl resin which is formed by coating a polyacryl varnish and baking the coated layer, said polyacryl varnish comprising a copolymer of (a) at least one compound represented by the formula (1),

and (b) at least one compound represented by the formula (11),

and (c) at least one unsaturated organic acid having from 3 to about 30 carbon atoms and at least one double bond which is reactable with the double bond of the compound of the formula (1) or (11), wherein $R_1$ represents a hydrogen atom or an alkyl group having 1 to about 30 carbon atoms, $R_2$ represents a cyano group, an aldehyde group or a carboxyalkyl ester group having 2 to about 30 carbon atoms, and $R_3$ and $R_4$ each represents a hydrogen atom, an organic group having 1 to about 30 carbon atoms selected from the group consisting of an alkyl group, an amide group, an N-alkylamide group, an alkylol group, a glycidyl-ethergroup and a glycidylester group.

6. A method for manufacturing a metal cored board, which comprises a step to coat the surface of a hardly oxidizable metal layer of an electrically conductive metal foil with an insulating varnish, a step to bake a layer of the varnish, and a step to adhere a metal core on the baked varnish layer.

7. A method of claim 6, wherein the insulating varnish is an electrodeposition varnish.

* * * * *